(12) United States Patent
Lin et al.

(10) Patent No.: US 6,930,038 B2
(45) Date of Patent: Aug. 16, 2005

(54) DUAL DAMASCENE PARTIAL GAP FILL POLYMER FABRICATION PROCESS

(75) Inventors: Chingfu Lin, Taipei (TW); Hsueh-Chung Chen, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 333 days.

(21) Appl. No.: 09/863,647

(22) Filed: May 23, 2001

(65) Prior Publication Data

US 2005/0085069 A1    Apr. 21, 2005

(51) Int. Cl.⁷ .......................................... H01L 21/4763
(52) U.S. Cl. ...................... 438/633; 438/637; 438/631; 438/700
(58) Field of Search ................. 438/623, 633, 438/637, 734, 700, 631

(56) References Cited

U.S. PATENT DOCUMENTS

| | | | | |
|---|---|---|---|---|
| 5,420,078 A | * | 5/1995 | Sikora | 438/618 |
| 6,042,999 A | * | 3/2000 | Lin et al. | 430/316 |
| 6,121,130 A | * | 9/2000 | Chua et al. | 438/623 |
| 6,319,815 B1 | * | 11/2001 | Iguchi et al. | 438/624 |
| 6,362,093 B1 | * | 3/2002 | Jang et al. | 438/633 |

* cited by examiner

Primary Examiner—Amir Zarabian
Assistant Examiner—Christy Novacek
(74) Attorney, Agent, or Firm—J.C. Patents

(57) ABSTRACT

A substrate having a conductive layer is provided. A dielectric layer is then formed above the conductive layer. At least one via hole is then formed in the dielectric layer, to expose a portion of the conductive layer. The conductive layer is then covered with a gap fill polymer layer, to completely fill the via hole. A chemical mechanical polishing step is performed to remove the partial gap fill polymer layer on the outside of the via hole. An etching step, is performed to remove a portion of partial gap fill polymer layer remaining in the via hole, resulting in a partial gap fill polymer. A lithographic process is conducted to form a patterned photoresist layer over the dielectric layer. The photoresist layer has an opening that exposes the via hole and partial gap fill polymer. A portion of the dielectric layer exposed by the opening is etched away, to form a trench in the dielectric layer. The photoresist layer and the partial fill polymer layer are then removed, to expose a part of the conductive layer. The via hole and trench are filled with metal material, to form a plug and line simultaneously.

16 Claims, 5 Drawing Sheets

DUAL DAMASCENE PARTIAL GAP FILL POLYMER FABRICATION PROCESS

BACKGROUND OF THE INVENTION

1. Field of the Invention

The present invention relates to a dual damascene process of a semiconductor process. More particularly, the present invention relates to a dual damascene partial gap fill polymer fabrication process.

2. Description of the Related Art

In the fabrication of metal interconnects, damascene processes first form a trench and a via in the dielectric layer and then the trench and the via is filled with metal, in order to form a metal line and a plug. This method is used especially on metal that is difficult to etch. The dual damascene process is a method that forms both a metal line and plug simultaneously. That is to say, a trench and via are formed in the dielectric layer and the trench and via are filled simultaneously to form a metal line and plug. Among various dual damascene fabrication processes, a method exists wherein a via is formed and then a trench is formed. This process is known as the "via first dual damascene process". The steps of this conventional process are outlined below. As shown in 1A, a substrate 100 is provided. Metal layer 100 has already been formed on substrate 100 provided. Silicon nitride passivation layer 120, silicon oxide layer 130, etching stop layer 140, which is composed of silicon material, and silicon oxide layer 150 are formed sequentially over metal layer 110. Silicon oxide layer 150, etching stop layer 140, and silicon oxide layer 130 are sequentially patterned to form a via hole 160. Via hole 160 exposes a part of silicon nitride passivation layer 120.

As shown in FIG. 1B, photoresist layer 170 is formed over silicon oxide layer 150 and fills via hole 160 (the filled state is not shown). A lithographic process is conducted to pattern photoresist layer 170, in order to form trench 180 in photoresist layer 170. Trench 180 exposes via hole 160.

As shown in FIG. 1C, using photoresist layer 170 as a mask, silicon oxide layer 150 is etched until etching stop layer 140 is exposed, to form trench 190 in silicon oxide layer 150. Photoresist layer 170 and silicon nitride passivation layer 120 at the bottom of via hole 160 is removed to expose a portion of metal layer 110, which allows the plug, formed in a later step and the metal layer to be connected.

However, as the dimensions of electrical devices continues to decrease, the conventional via first dual damascene causes the problem of fencing to emerge. This problem is described below. As shown in FIG. 1B, the aspect ratio of via hole 160 increases as device size decreases. As a result, photoresist layer 170 remains on the bottom and inner walls of via hole 160, after lithography has been conducted. As shown in fig IC, when silicon oxide layer 150 is etched to form trench 190, photoresist layer 170 remaining on the inner walls of via hole 160 obstruct the etching of the periphery of silicon oxide layer 150. As a result, fencing 150a occurs around the edge of via hole 160. Fencing obstructs the filling of metal into depressed region 199 as shown in FIG. 1C. Moreover, fencing reduces the cross sectional area of the conductive line formed in a subsequent step.

A dual damascene partial gap fill polymer fabrication process has been proposed to resolve the problem of fencing caused by the inability to completely remove photoresist layer from the via hole. The steps of this conventional method are outlined below.

As shown in FIG. 2A, substrate 200 having metal layer 210 is provided. Silicon nitride passivation layer 220, silicon oxide layer 230, etching stop layer 240 composed of silicon nitride material and silicon oxide layer 250 are formed sequentially on substrate 200. Silicon oxide layer 250, etching stop layer 240, and silicon oxide layer 230 are patterned sequentially, to form via hole 260 which exposes a portion of silicon nitride passivation layer 220. Via hole 260 is then filled with partial gap fill polymer 262.

As shown in FIG. 2B, silicon oxide layer 250 is covered by photoresist layer 270, which also fills trench 260 (filled state not shown). A lithographic process is conducted to pattern photoresist layer 270, to form trench 280. Because via hole 260 has already been filled with partial gap fill polymer 262, photoresist layer 270 in via hole 260 is shallow. Thus, photoresist layer 270 can be completely removed during the lithographic process.

As shown in FIG. 2C, using photoresist layer 270 as a mask, silicon oxide layer 250 is etched until etching stop layer 240 is exposed. Photoresist layer 270 and partial fill gap polymer 262 are removed. Passivation layer 220 on the bottom portion of via hole 260 is removed, to expose a portion of metal layer 210 allowing the plug formed in a later step and metal layer 210 to be connected.

The conventional partial gap fill polymer process, however, can only be used with isolated via holes and, thus, cannot resolve the problem of fencing associated with dense via holes. The reason lies in the fact that the number of dense via holes within a unit of area is greater than the number of isolated via holes. Thus, when partial gap fill polymer is deposited, the portion of partial gap fill polymer in each dense via hole is much less. As a result, the height of the partial fill polymer within dense via holes is much lower. Consequently, the photoresist layer filling the dense via holes is deeper, which causes photoresist layer to remain on the inner walls of dense via holes after lithography and leads to fencing.

SUMMARY OF THE INVENTION

The invention provides a dual damascene partial gap fill polymer process that can be used to solve the problem of fencing associated with the conventional method of filling dense via holes with partial gap fill polymer. The steps of this process are outlined below.

First a substrate having a conductive layer is provided. The conductive layer can be a line, for example. A dielectric layer is then formed above the conductive layer. The material of the dielectric layer can be a silicon oxide or a material with a low dielectric constant. A first via hole is then formed in the dielectric layer, to expose a portion of the conductive layer. The conductive layer is then covered with a gap fill polymer layer, to completely fill the via hole. A chemical mechanical polishing step is performed to remove the partial gap fill polymer layer on the outside of the via hole. An etching step, is performed to remove a portion of partial gap fill polymer layer remaining in the via hole, resulting in a partial gap fill polymer. The etching method for this step can include anisotropic etching. A lithographic process is conducted to form a patterned photoresist layer above the dielectric layer. The photoresist layer has an opening that exposes the via hole and partial gap fill polymer. A portion of the dielectric layer exposed by the opening is etched away, to form a trench in the dielectric layer. The photoresist layer and the partial fill polymer layer are then removed, to expose a part of the conductive layer. The via hole and trench are filled with metal material, to form a plug and line simultaneously. There can be two via holes in the dual damascene partial gap fill polymer of the present invention. They include an isolated via hole and a dense via hole.

The dual damascene partial gap fill polymer, as embodied and broadly described herein, includes over-spilling the partial gap fill polymer layer, using a chemical mechanical polishing method to remove gap fill polymer layer on the outside of the via hole, and performing an etch back procedure to form a partial fill gap polymer. Thus, when the substrate has both isolated and dense via holes, the height of the partial fill gap polymer in dense via holes is increased, so that it is equal to the height partial gap fill polymer in isolated via holes. Consequently, during the subsequent lithographic process, photoresist layer will not remain on the inner walls of the dense via holes. As a result, fencing can be prevented during the later step of etching the dielectric layer, which aids the process of metal filling and prevents the area of the lines from being reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

Figure 1A:
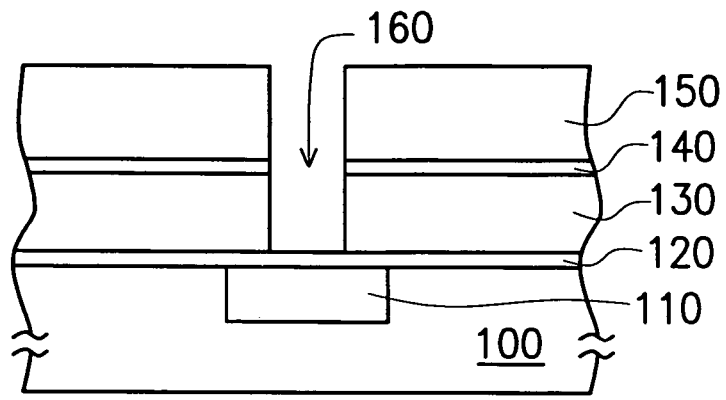
FIGS. 1A–1C is a schematic cross-sectional drawing illustrating a conventional via first dual damascene fabricating process.
Figure 1B:
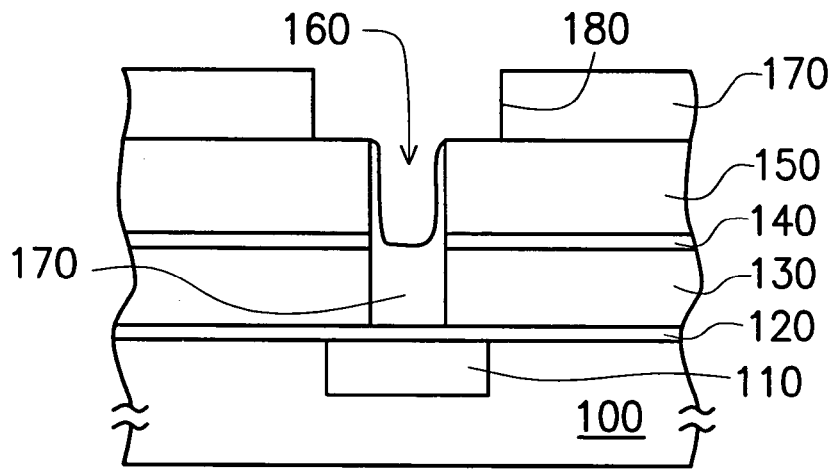
Figure 1C:
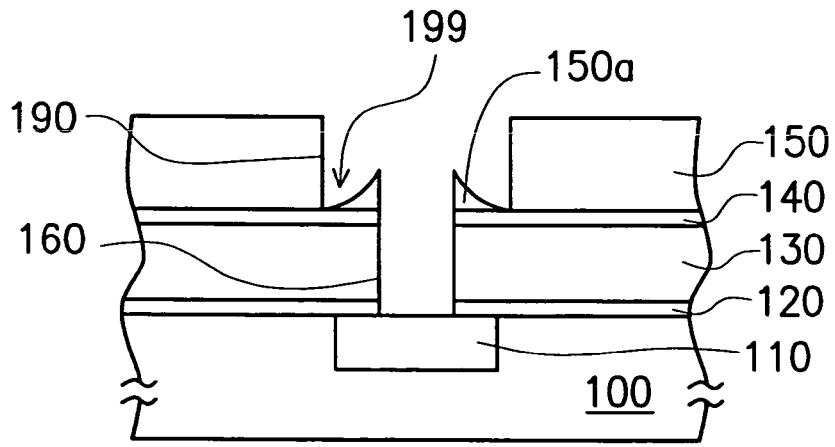
Figure 2A:
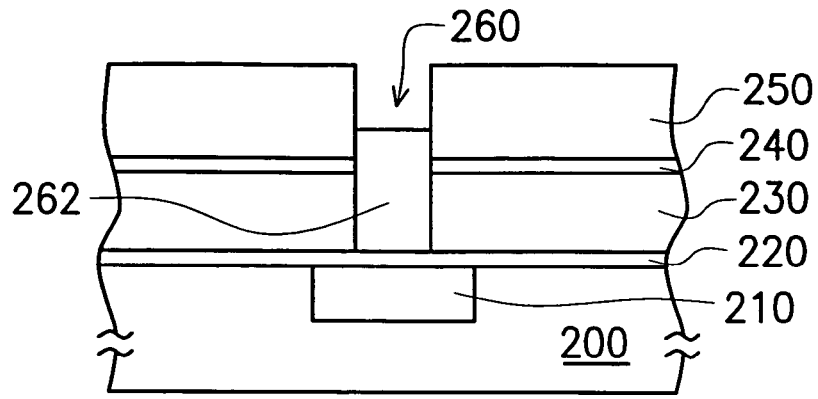
FIGS. 2A–2C is a schematic cross-sectional drawing illustrating the fabrication of a conventional dual damascene partial gap fill polymer.
Figure 2B:
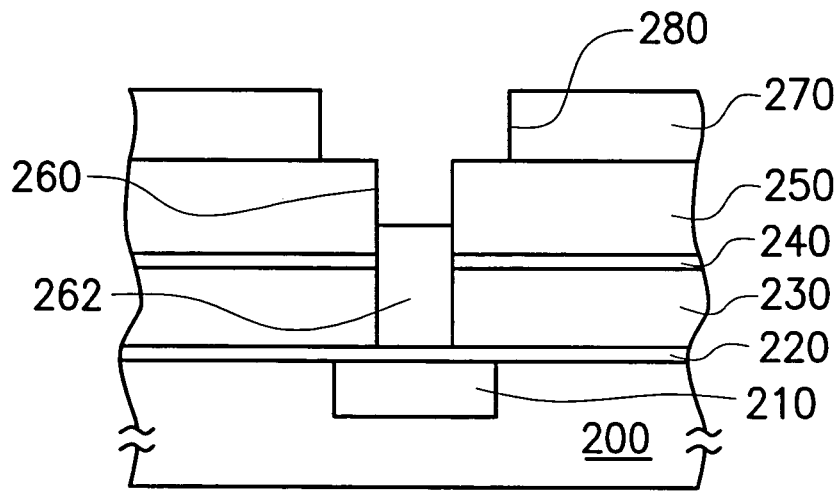
Figure 2C:
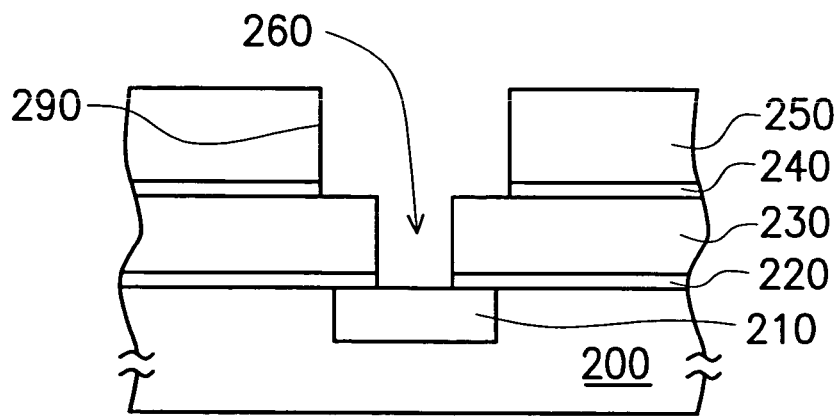

Reference will now be made in detail to the present preferred embodiments of the invention, examples of which are illustrated in the accompanying drawings. Wherever possible, the same reference numbers are used in the drawings and the description to refer to the same or like parts.

As shown in FIG. 3, substrate 300 is provided. Conductive layer 110 which is used for electrical connection is formed in substrate 300. Conductive layer 310 can be a conductive line, for example. The material of conductive layer 310 can be metal, for example. Passivation layer 320, a first dielectric layer 330, etching stop layer 330 and a second dielectric layer 350 are formed sequentially over the conductive layer 310. The material of etching stop layer 340 and passivation layer 320 is preferably the same material. Etching stop layer 340 and passivation layer 320 are both silicon nitride, for example. The material of first dielectric layer 330 and second dielectric layer 350 is preferably the same. The material of first dielectric layer 330 and second dielectric layer 350 is silicon oxide or an organic material with a low dielectric constant. Second dielectric layer 350, etching stop layer 340, and first dielectric layer 330 are sequentially patterned to form isolated via hole 360a and dense via hole 360b. Isolated via hole 360a and dense via hole 360b both expose a portion of passivation layer 320.

Figure 3A:
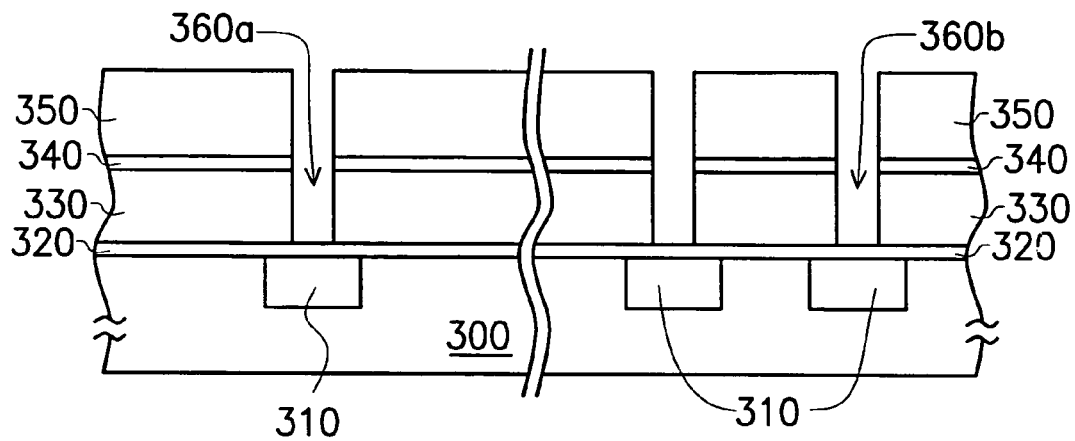
FIGS. 3A–3F is a schematic cross-sectional drawing showing the fabrication of a dual damascene partial gap fill polymer, according to a preferred embodiment of this invention.
Figure 3B:
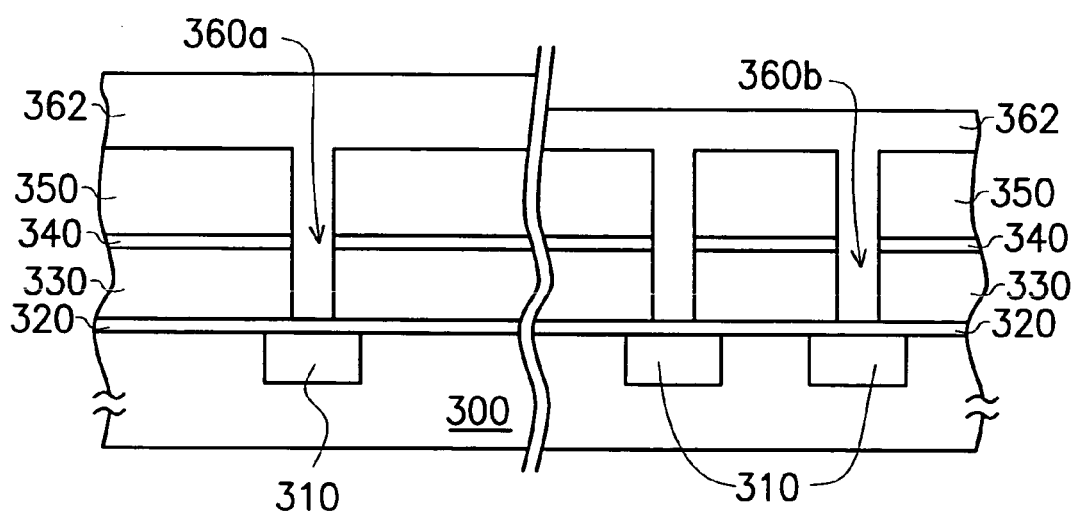

As shown in FIG. 3B, second dielectric 350 is covered by gap fill polymer layer 362, which completely fills isolated via hole 360a and dense via hole 360b. Because there are a greater number of dense via holes 360b in a unit of area, the amount of fill gap polymer 362 that fills the via holes 360b is greater, and as a result, the fill gap polymer 362 that remains above the surface of the via holes 360b is not as thick.

Figure 3C:
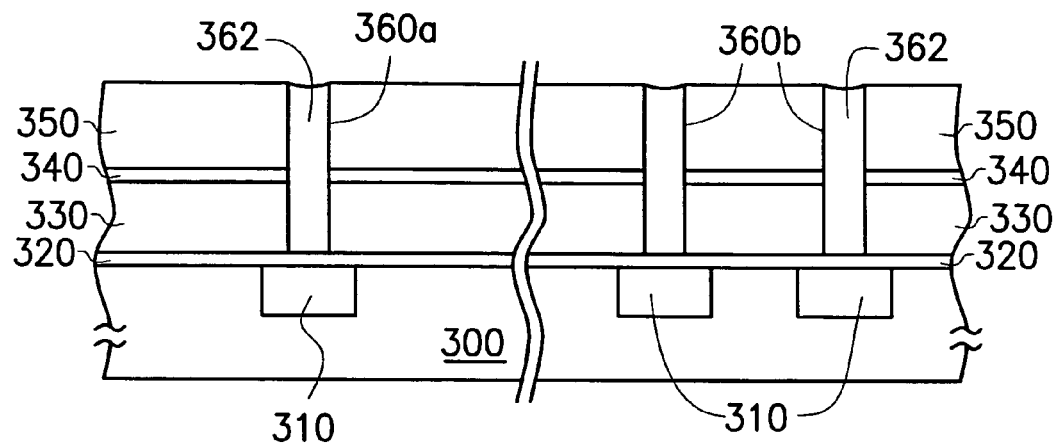

As shown in FIG. 3C, a chemical mechanical polishing (CMP) step is performed to remove fill gap polymer layer 362 on the outside of isolated via hole 360a and dense via hole 360b, so that fill gap polymer layer 362 remaining in isolated via hole 360a and 360b have a similar thickness.

Figure 3D:
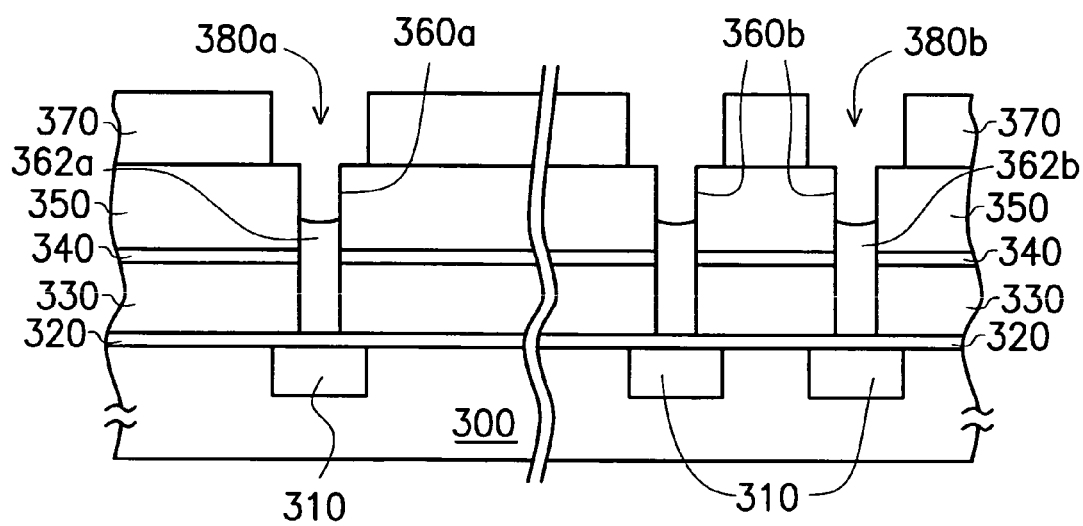

As shown in FIG. 3D, an etching step is performed to simultaneously remove a portion of fill gap polymer layer 362 in isolated via hole 360a and 360b and to form partial fill gap polymer (pGFP) 362a and 362b, respectively. The etching method used in this step can be anisotropic etching, for example. Second dielectric layer 350 is then completely covered by photoresist layer 370, to fill isolated via hole 360a and dense via hole 360b (the filled state is not shown). A lithographic process is conducted to form openings 380a and 380b in photoresist layer 370. Openings 380a and 380b expose isolated via hole 360a and partial gap fill polymer layer 362a and dense via hole 360b and partial gap polymer 362b, respectively. Isolated via hole 360a and dense via hole 360b are both filled with partial gap fill polymers 362a and 32b having the same thickness. Thus, photoresist layer 370 will not remain on the inner walls of isolated via hole 360a and dense via hole 360b.

Figure 3E:
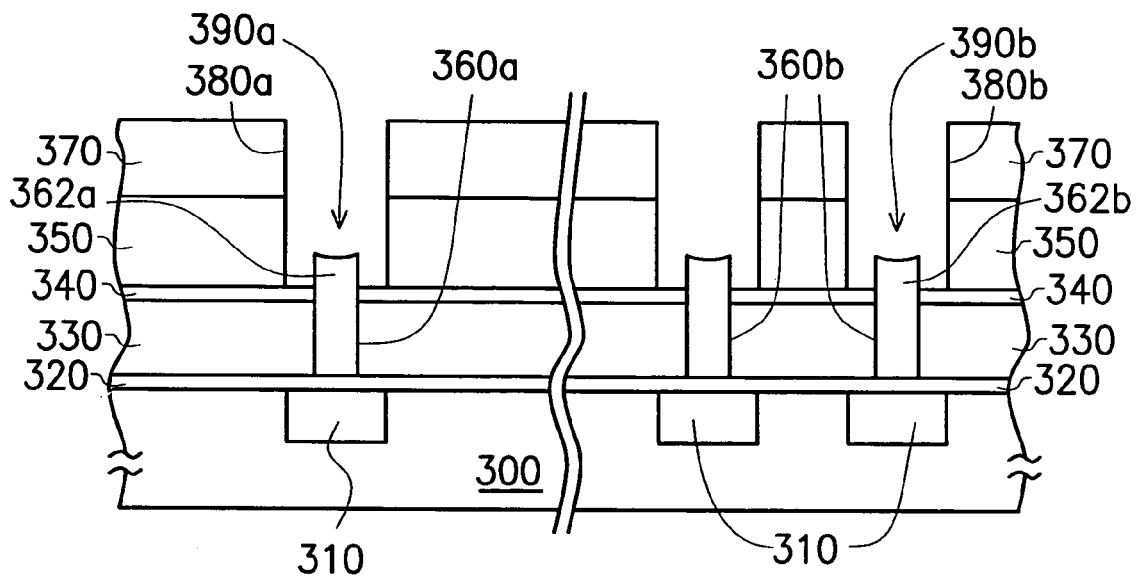

As shown FIG. 3E, photoresist layer 370 is used as a mask to etch the second dielectric layer 350 until etching stop layer 340 is reached, in order to form trench 390a passing through isolated via hole 360a and trench 390b passing through dense via hole 360b, in second dielectric layer 350.

Figure 3F:
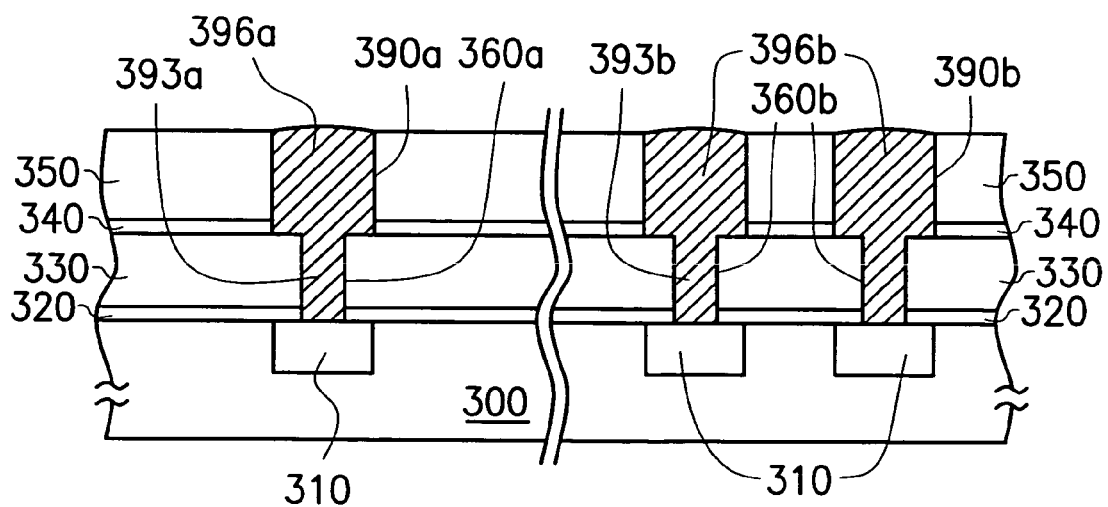

As shown in FIG. 3F, photoresist layer 370 is removed along with partial fill gap polymers 362a (362b). Passivation layer 320 at the bottom of isolated via hole 360a and dense via hole 360b is removed, to expose conductive layer 310. Trench 390a and isolated via hole 360a are filled with metal material, to form plug 393a in isolated via hole 360a and conductive line 396a in trench 390a. At the same time, trench 390b and dense via hole 360b are filled with metal material, to form plug 393b in dense via hole 360b and conductive line 396b in trench 390b.

In the fabrication process of a partial gap fill polymer according to a preferred embodiment of the present invention, an excess gap fill polymer layer 362 is formed. A chemical mechanical polishing step is performed to remove gap fill polymer layer 362 on the outside of isolated via hole 360a and dense via hole 360b. An etching back step is conducted to form partial fill gap polymers 362a and 362b. Thus, the height of the partial gap fill polymer 362b in dense via hole 360b is raised and is similar to the height of partial gap fill polymer 362a in isolated via hole 360a. As result, when lithography is conducted in a later step, photoresist layer 370 filling dense via hole 360b becomes shallow and will not remain on the inner wall of dense via hole 360b after exposure. Fencing can be avoided in the subsequent process of etching the dielectric layer, which aids the later process of metal filling and prevents the area of the lines from being reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual damascene partial gap fill polymer fabrication process, comprising:
   providing a substrate having a conductive layer therein;
   forming a dielectric layer over the substrate and conductive layer;
   forming at least one via hole in the dielectric layer, to expose a portion of the conductive layer;
   covering the dielectric layer with a gap fill polymer, to fill the via hole;
   performing a chemical mechanical polishing step to remove the gap fill polymer layer on the outside of the via hole;
   performing an etching step to remove a portion of the gap fill polymer layer remaining on the inside of the via hole, forming a partial gap fill polymer, while the dielectric layer is substantially not etched in this etching step;
   performing a lithographic process to form a photoresist layer having an opening above the dielectric layer, wherein the opening exposes the via hole and the partial gap fill polymer;
   etching a portion of the dielectric layer exposed in the opening, to form a trench in the dielectric layer;
   removing the photoresist layer and the partial gap fill polymer, to expose a portion of the conductive layer; and
   filling the via hole and the trench with a metal material, to simultaneously form a plug and a first conductive line.

2. The method of claim 1, wherein forming at least one via hole includes forming a plurality of isolated via holes and a plurality of dense via holes, wherein a distance between neighboring dense via holes is smaller than a distance between neighboring isolated via holes.

3. The method of claim 1, wherein the etching step for removing a portion of the gap fill polymer layer remaining on the inside of the via hole includes anisotropic etching.

4. The method of claim 1, wherein the conductive layer in the substrate includes a second conductive line.

5. The method of claim 1, wherein a material of the dielectric layer includes silicon oxide.

6. The method of claim 1, wherein the dielectric layer includes an organic material having a low dielectric constant.

7. A dual damascene partial gap fill polymer fabrication process, comprising:
   providing a substrate having a conductive layer therein, and a passivation layer formed over the conductive layer;
   sequentially forming a first dielectric layer, a first etching stop layer and a second dielectric layer over the passivation layer;
   sequentially patterning the second dielectric layer, the etching stop layer and the first dielectric layer to form at least one via hole, which exposes a portion of the passivation layer;
   covering the second dielectric layer with a gap fill polymer layer, to fill the via hole;
   performing a chemical mechanical polishing step to remove gap fill polymer layer on the outside of the via hole;
   performing an etching step to remove a portion of the gap fill polymer layer remaining in the via hole, in order to form a partial gap fill polymer, while the second dielectric layer is substantially not etched in this etching step;
   performing a lithographic process to form a photoresist layer having an opening above the second dielectric layer, wherein the opening exposes the via hole and the partial gap fill polymer;
   etching the exposed second dielectric layer until the etching slop layer is reached, to form a trench in the second dielectric layer;
   removing the photoresist layer and the partial gap fill polymer;
   removing the passivation layer on a bottom of the via hole to expose a portion of the conductive layer; and
   filling the trench with a metal material to simultaneously form a plug and a first conductive line.

8. The method of claim 7, wherein forming at least one via hole includes forming a plurality of isolated via holes and a plurality of dense via holes, wherein a distance between neighboring dense via holes is smaller than a distance between neighboring isolated via holes.

9. The method of claim 7, wherein the etching step for removing a portion of the gap fill polymer layer remaining in the via hole includes anisotropic etching.

10. The method of claim 7, wherein the conductive layer in the substrate includes a second conductive line.

11. The method of claim 7, wherein a material of the conductive layer includes metal.

12. The method of claim 7, wherein materials of the passivation layer and the etching stop layer are the same.

13. The method of claim 12, wherein the materials of the passivation layer and the etching stop layer include silicon nitride.

14. The method of claim 7, wherein materials of the first and second dielectric layers are the same.

15. The method of claim 14, wherein the materials of the first and second dielectric layers include silicon oxide.

16. The method of claim 14, wherein the materials of the first and second dielectric layers include an organic material having a low dielectric constant.

* * * * *